United States Patent Office 3,353,955
Patented Nov. 21, 1967

3,353,955

STRATUM TRANSFER PROCESS BASED ON ADHESIVE PROPERTIES OF PHOTOPOLYMERIZABLE LAYER

Richard Sheldon Colgrove, Milltown, N.J., assignor to E. I. du Pont de Nemours and Company, Wilmington, Del., a corporation of Delaware No Drawing. Filed Oct. 14, 1964, Ser. No. 403,938
11 Claims. (Cl. 96—28)

This application is a continuation-in-part of application Ser. No. 375,629, filed June 16, 1964, now abandoned.

This invention relates to a process for image reproduction, and more particularly, to a process for forming images by means of photopolymerizable laminated elements.

Various processes for producing copies of an image by photopolymerization and thermal transfer are known. However, they are limited in the scope of their application. For example, because the transfer elements of the prior art depend on high temperatures to soften the composition to its stick temperature, special equipment is required. Heated pressure rollers are required to effect transfer of the unexposed polymerizable material which forms the image complementary to that formed by the polymerized material. It is also difficult to maintain dimensional fidelity of reproduced images relative to the original because of temperature changes. In the prior art processes, the separation of exposed polymerized image material and unexposed complementary image material depends on differences in "stick" temperature or tackiness between the polymerized and unpolymerized photopolymerizable composition. As photopolymerization is brought about by means of exposure to actinic radiation, the temperature at which the polymerized material is tacky is increased above the temperature at which image transfer takes place. These processes all have the disadvantage that transferred unexposed polymerizable material remains tacky unless special precautions are taken, for example, by submitting the transferred unexposed unpolymerized image to the step of post exposure to actinic radiation. Tacky layers, of course, are undesirable, especially where several sheets are stored in superposed position.

It has now been discovered that the above disadvantages can be overcome and the prior art processes simplified. It has also been found that reproduction processes utilizing photopolymerizable compositions can be carried out without relying on tackiness or stick temperature.

It is therefore an object of this invention to provide new and more practical processes for forming images by photopolymerization. A further object is to provide photopolymer image reproduction processes which are operable at room temperatures and are not dependent on differences in tackiness between polymerized and unpolymerized material. It is also an object to provide such processes which require a minimum of apparatus. A still further object is to provide processes for forming both positive and negative images on separate supports at room temperature from one exposure and one delaminating operation, said images being clear and sharp and having good resolution and uniform density. A further object is to provide a process of forming photopolymerized images having good dimensional stability and low background stain. Other objects will appear hereinafter.

The above objects are accomplished in the process of this invention which, in its broader aspects, comprises exposing imagewise with actinic radiation and then separating by peeling at room temperature, a laminated photopolymerizable element comprising two supports having different adhesive forces for polymerized and unpolymerized photopolymerizable compositions, said supports having pressure-laminated therebetween at a temperature of at least 50° C. a thin stratum of a photopolymerizable composition. The photopolymerizable composition is characterized in that in its polymerized state at room temperature, it has greater adhesion for one support than the other and in its unpolymerized state, it has greater adhesion for the second support than for the first. The photopolymerizable stratum is further characterized in that it is solid at room temperatures in either its polymerized or unpolymerized state. In other words, if $A_1$ and $A_2$ represent the adhesive strengths of the unpolymerized stratum to supports 1 and 2 and $A'_1$ and $A'_2$ represent the adhesive strengths of the stratum in the polymerized state then the conditions suitable for producing clear, sharp negative images by peeling apart the imagewise exposed laminated element may be expressed as follows:

$$A_1 < A_2 \text{ and } A'_1 > A'_2$$

Preferably, the value of $A_1$ should be at least 2 grams/linear inch and $A_2 - A_1$ should give a positive number and be less than 100 grams/linear inch as determined by the Instron Tensile testing machine manufactured by the Instron Engineering Corporation of Quincy, Mass. The value of the cohesive strength of the photopolymerizable composition, both exposed and unexposed, must be greater than $A_1$, $A_2$, $A'_1$ and $A'_2$.

The test for the various forces merely involves measuring at room temperature the load necessary to peel apart one inch wide strips of the laminated elements, both exposed to actinic radiation and unexposed. By room temperature as used herein it is intended that a range of temperatures from 10° C. to 40° C. shall be included.

The photopolymerizable stratum may comprise any of the photopolymerizable compositions disclosed in assignee's Plambeck U.S. Patent 2,760,863 patented Aug. 29, 1956, which are solid and non-tacky at room temperature. In addition to the ethylenically unsaturated compounds containing at least one terminal ethylenic group as exemplified by the monomers described in the Plambeck patent, other monomeric compounds such as those described in assignee's Celeste and Seide, U.S. patent application, Ser. No. 274,909, filed Apr. 23, 1963, now U.S. Patent 3,261,686, and assignee's patent application Ser. No. 370,338, by Cohen and Schoenthaler, filed May 26, 1964, may be used. Materials to serve as coating and laminating supports may include a wide variety of synthetic polymeric sheets, fibrous sheets such as papers of the opaque and semi-opaque variety, i.e., glassine and papers used in the printing trades and metal sheets such as aluminum. The primary requirement being that at room temperature the adhesive forces between the supports and the photopolymerizable stratum must be uniform and satisfy the values set forth above and the cohesive strength of the photopolymerizable composition must be greater than any of the adhesive forces. Both supports preferably should have a low permeability to oxygen.

The above conditions are met by coating on a support (1), a photopolymerizable composition comprising a polymeric binder and an ethylenically unsaturated monomer having a molecular weight of at least 295, in a ratio of from about 10 to not more than 70 parts of monomer per 100 parts of binder-monomer composition and containing from 0.2 to 50 parts of a particulate material and/or a coloring matter based on the total dry weight of the composition, to give a dry coating thickness of not greater than 0.0005 inch. Thicker layers may be used but the image quality is not quite as good. The composition also contains an addition polymerization initiator, activatable by actinic radiation, in an amount of 0.001 to 20 parts by weight of the components. Any suitable particulate material and/or coloring matter may be used but preferably the photopolymerizable stratum should have an optical density equal to or greater than 0.80. For example, colloidal carbon, titanium dioxide, barium sulfate and various colored pigments may be used as particulate materials. Various organophilic silicas, bentonites colloidal silicas, and powdered glass can also be admixed with the colored dyes and pigments.

After coating, a second film (2), preferably having a matte surface, and for which $A_2>A_1$ for unexposed photopolymerizable material at room temperature, is laminated to the surface of the photopolymerizable layer at temperatures ranging from 50° C. to 150° C. and pressures from 40 to 150 pounds per square inch. The second film (2) may have the matte or anchoring characteristic as an integral part of the film rather than as a separate layer.

The element is exposed to actinic radiation, preferably through the transparent support having the lower adhesion for the unpolymerized polymer on which it is desired to have the polymerized portion adhere. The exposure may be by means of a light source which is rich in ultraviolet radiation through a halftone image transparency, e.g., process negative or positive (an image-bearing transparency consisting solely of substantially opaque and substantially transparent areas where the opaque areas are substantially of the same optical density). Engineering drawings are also to be considered within the purview of the above description. The image or transparency may or may not be in operative contact with the surface of the photopolymerizable laminated element, e.g., contact exposure or projection exposure. For exposures through transparent film supports the time required will range from a few seconds to several minutes depending on the intensity of the exposing radiation and the inherent photographic speed of the composition. After exposure, the supporting films are separated by peeling apart at ordinary room temperature, approximately 20° C. For best results the supports are separated at a moderate rate of about 0.1 to 25 inches per second. In the preferable procedure the exposed areas of the photopolymerizable stratum adhere to the transparent support (Adhesion=$A_1'$) through which the exposure was made to form a negative image of the original and the unexposed areas adhere to the opposite support (Adhesion=$A_2$) furthest from the exposing source to form a direct positive. In most cases the direct positive will be on the support which was laminated to the surface of the photopolymerizable stratum after coating. Support (2) preferably has a matte surface as a separate layer or integrally therewith, or a surface treated in such a manner that the adhesion of the unpolymerized composition to this surface ($A_2$) is greater than the adhesion of said composition to the original surface on which it was coated ($A_1$).

As a support (1) on which the photopolymerizable composition is coated, there may be mentioned several types of substantially transparent films. Films composed of high polymers, e g., polyamides, polyolefins, polyesters, vinyl polymers and cellulosics are quite suitable and in order for the above adhesive relationships to obtain these films may or may not contain an auxiliary layer to control anchorage. Specific high polymer films from each of the above classes include: polyamides, i.e., polyhexamethylene sebacamide, polyhexamethylene adipamide; polyethylene, polypropylene, polyesters, i.e., polyethylene terephthalate, polyethylene terephthalate/isophthalate copolymers of British Patent 766,290; vinyl acetals, vinylidene chloride copolymerized with vinyl chloride, styrene and acrylonitrile, cellulose acetate, cellulose acetate/butyrate, viscose rayon, etc.

Films or sheets suitable for laminated support (2) may be taken from any of the above polymeric films. The surface to be laminated to the surface of the photopolymerizable stratum is modified so that the adhesion ($A_2$) of the unpolymerized stratum is greater than the adhesion ($A_1$) to the substantially transparent film support. Suitable laminating supports include the translucent drafting films described and claimed in assignee's Van Stappen U.S. Patent 2,964,423, dated Dec. 13, 1960, Centa et al., U.S. Patent 3,115,420, dated Dec. 24, 1963, and Van Stappen U.S. Patent application Ser. No. 29,580, filed May 17, 1960. The above patents and patent application comprise a polyester support having thereon a layer containing a particulate material. In the above patents the layer comprises a urea-formaldehyde resin having dispersed therein a solid inorganic toothing agent having an average particle size from 0.1 to 10 microns. In the above Van Stappen application, the particulate material consists of polyamide or interpolyamide resins in discrete particle form of 0.1 to 10 microns in size. Suitable supports may also be used wherein the particulate material is dispersed throughout the film rather than in a surface coating. The film supports of Alles et al., U.S. Patent 2,627,088 are also suitable. The films disclosed and claimed therein comprise a polyester film having on the surface thereof as an anchoring layer, a copolymer containing at least 35% vinylidene chloride, the remainder comprising an acrylic acid ester and itaconic acid. Other surface treatments which will provide the laminating supports with the required adhesion characteristics comprise flame treating, treatment with electrostatic discharge, and also treating with chromic acid.

As indicated above, the photopolymerizable compositions may comprise any suitable binder, and an ethylenically unsaturated monomer. In addition, the composition will contain a polymerization initiator activatable by actinic radiation and a particulate material and/or a coloring matter. The compositions may also contain an addition polymerization inhibitor and/or thermal inhibitor. The composition may also contain auxiliary plasticizers and/or surfactants. The binder may be of the same general type as the polymerizable monomer being used and may be soluble therein and plasticized thereby, although this is not a critical requirement. Polymeric binders which have been found to be suitable include cellulose acetate butyrate, polymethyl methacrylate, methyl methacrylate copolymerized with methacrylic acid, and the polymer of piperazine 2-urethane.

As mentioned above, ethylenically unsaturated monomers capable of addition polymerization which have been found especially suitable are those disclosed in assignee's Celeste and Seide, U.S. Patent application, Ser. No. 274,909, filed Apr. 23, 1963, representatives of which are pentaerythritol diacrylate and triacrylate and trimethacrylate and dipentaerythritol tetraacrylate. Other monomers include polyethylene glycol (M.W. 300–600) diacrylates and methacrylates and the reaction products of trimethylolpropane, ethylene oxide and acrylic and methacrylic acids as disclosed and claimed in assignee's application, Ser. No. 370,338, by Cohen and Schoenthaler, filed May 26, 1964.

The invention will now be further illustrated by, but is not intended to be limited to, the following detailed examples.

*Example I*

The following photopolymerizable composition was prepared:

| | Grams |
|---|---|
| Copolymer of methyl methacrylate/methacrylic acid (in a mol percent of 98.5/1.5) | 48.75 |
| Polyethylene glycol (M.W. 300 of polyethylene glycol) diacrylate | 35.00 |
| 2-ethyl-9,10-anthraquinone | 6.50 |
| Carbon black (particle size 13 millimicrons) | 9.75 |

Methyl ethyl ketone to make a 15% solids dispersion.

The resulting dispersion was coated on a .004 inch thick, clear polyethylene terephthalate, film support to give a solid layer having a dry coating thickness of approximately 0.0002 inch and having an optical density of 2.0. To the surface there was then laminated a sheet of drafting film manufactured in the manner of Example I of Van Stappen U.S. Patent 2,964,423. The lamination was carried out by placing the drafting film with the drawing surface in contact with the photopolymerizable layer and passing the films as a unit between rollers at a pressure of about 50 pounds per square inch with the rollers heated to approximately 110° C.

The resulting element was exposed through a positive transparency and through the clear polyethylene terephthalate film support to actinic radiation provided by a 20-watt G.E. blue fluoroescent lamp mounted in a "Roto-lite" exposure unit (manufactured by Fred Brewer, Inc.), for approximately 15 seconds. After exposure, the original and laminated support were separated by manually stripping at a temperature of about 25° C. (approximately room temperature). The exposed areas of the photopolymerized stratum adhered to the original polyethylene terephthalate support to form a clear, sharp negative of the original image while the unexposed, unpolymerized areas of the stratum adhered to the drafting film to form a clear, sharp positive of the original image. Both images showed excellent dimensional fidelity. A sample of the unexposed element, when delaminated showed that all of the unexposed photopolymerizable stratum adhered to the drafting film, indicating that $A_2$ was greater than $A_1$.

*Example II*

The following photopolymerizable composition was prepared:

| | Grams |
|---|---|
| Cellulose acetate butyrate | 46.0 |
| Pentaerythritol triacrylate | 23.0 |
| Triethylene glycol diacetate | 17.2 |
| Red pigment (color index No. 15850) | 11.5 |
| 2-ethyl-9,10-anthraquinone | 2.3 |

Methyl ethyl ketone to make a 16% solids dispersion.

The resulting composition was thoroughly mixed by ball-milling and then coated and laminated on the film supports as described in Example I. After lamination, the element was exposed for 18 seconds through a halftone positive image through the clear, polyethylene terephthalate film support by means of an exposing device identified as a "nuArc Plate Maker (flip-top)" manufactured by the nuArc Company, Chicago, Ill. This device uses a carbon arc as a light source. After exposure, the two film supports were separated by peeling apart at the rate of about one inch per five seconds at room temperature. A clear, sharp positive image adhered to the drafting film and a negative, polymerized image remained on the clear, polyethylene terephthalate film.

*Example III*

The following composition was prepared:

40 grams of the triacrylate of the reaction product of trimethylol propane with 20 moles of ethylene oxide
30 grams polymethyl methacrylate (Inherent Viscosity: 0.20–0.22 for a solution of 0.25 gram in 50 mls. chloroform, at 20° C., using a No. 50 Cannon-Fenske Viscosimeter)
8 grams 9,10-phenanthrenequinone
30 grams fast black T.W., powder (available from Verona Dyestuffs, Union, N.J.)
5 grams methoxypolyethylene glycol hydrogen succinate in which the polyethylene oxide ether precursor had an average molecular weight of 750
887 grams trichloroethylene.

The resulting composition was thoroughly mixed by ball-milling for 72 hours and then coated on 0.001 inch polyethylene terephthalate film to give a solid layer having a dry coating thickness of 0.0002 inch with an optical density of 2.2.

A drafting film of the type used in Example I was laminated to the surface of the photopolymerizable stratum at a temperature of between 142 and 145° C. and at a pressure of 67 pounds per square inch. The resulting element was exposed through an engineering drawing through the clear film support in a Model 60W, "Revolute Rockette" exposing device, manufactured by the Bruning Corp., and the two film supports were stripped apart at room temperature with a clear, sharp positive image on the drafting film and a negative image remaining on the film support.

*Example IV*

The following photopolymerizable composition was prepared:

| | Grams |
|---|---|
| Polymethyl methacrylate of Example III | 3 |
| Monomer of Example III | 3.5 |
| 2-ethyl-9,10-anthraquinone | 0.4 |
| Carbon black (particle size 13 millimicrons) (15% dispersion in isopropanol) | 4.0 |
| Trichloroethylene to make | 80.0 |

The resulting composition was thoroughly mixed by ball-milling and coated on 0.001 inch thick transparent polyethylene terephthalate film to give a dry thickness of about 0.00015 inch. The surface of the photopolymerizable layer was laminated at 124° C. to the drawing surface of a drafting film of the type described in Example I of Van Stappen U.S. 2,964,423 issued Dec. 13, 1960. The optical density of the element was about 2.0. Upon testing a sample of the unexposed element on the Instron Tester described above, $A_1$ adhesion was found to be 9.6 grams per linear inch and all of the photopolymerizable stratum adhered to the drafting film indicating that $A_2$ was greater than $A_1$. After exposing a sample to actinic radiation to polymerize the polymerizable stratum, adhesion tests indicated $A'_2$ adhesion to the drafting film to be 17.2 grams per linear inch and upon delamination all of the polymerized stratum remained on the clear film. A sample of the laminated element was exposed for 2 minutes to a line drawing through the clear film support by means of the carbon arc exposing device described in Example II. After exposure, the two supports were delaminated by stripping apart at room temperature. A clear, sharp positive image free of background stain was found on the drafting film with an equally good quality negative remaining on the clear film. The positive showed good resolution with no indication of line discontinuity.

A sample of the above laminated element was exposed through a line copy image through the transparent film support by means of a Model 60W, "Revolute Rockette" exposing device manufactured by the Bruning Corporation and separated by peeling apart. The positive image on the drafting film was used as a master on an A. B. Dick Offset Duplicator, Model No. 320 and used to produce 600 good, clear, positive ink copies.

*Example V*

The coating composition of Example IV was coated on 0.0008 inch thick polypropylene to give a dry coating thickness of about 0.00018 inch. To the surface of the photopolymerizable stratum there was laminated at 100° C. a sheet of the drafting film described in Example IV. Upon exposure through an image and delamination as described in Example IV good quality positive and negative images were obtained with a positive image, located on the drafting film and a negative image remaining on the polypropylene film.

*Example VI*

The following photopolymerizable composition was prepared:

| | Grams |
|---|---|
| Polymethyl methacrylate of Example III | 3.0 |
| Monomer of Example III | 3.5 |
| 9,10-phenanthrenequinone | 0.4 |
| Carbon black (particle size 13 millimicrons) (15% in isopropanol) | 4.0 |
| p-Nitrosodimethylaniline | 0.1 |
| Trichloroethylene to make | 80.0 |

The resulting composition was thoroughly mixed by ball-milling and then coated on 0.001 inch polyethylene terephthalate film to give a coating thickness of 0.00011 inch. After drying there was laminated to the coated surface at about 100° C., a sheet of the drafting film described in Example IV. Upon measuring the adhesive forces as described above, the adhesion $A_1$ was found to be 10.7 grams per linear inch and $A'_2$ was found to be 13.0 grams per linear inch. Image exposed elements gave good, clear images after separation at room temperature.

*Example VII*

A photopolymerizable composition was prepared as follows:

| | Grams |
|---|---|
| Polymethyl methacrylate of Example III | 3.0 |
| Monomer of Example III | 3.5 |
| Carbon black (particle size 13 millimicrons) (15% in isopropanol) | 4.0 |
| 2-ethyl-9,10-anthraquinone | 0.4 |
| p-Nitrosodimethylaniline | 0.2 |
| Trichloroethylene to make | 80.0 |

The composition was thoroughly mixed by ball-milling and coated and laminated as described in Example VI. Adhesion tests as described above gave forces for $A_1$ of 10.3 grams per linear inch and $A'_2$ of 12.6 grams per linear inch. Image exposed elements gave good clear positive and negative images, when delaminated at room temperature, the positive image adhering to the drafting film and the negative image remaining on the clear film.

*Example VIII*

The following photopolymerizable composition was prepared:

| | Grams |
|---|---|
| Polymethyl methacrylate of Example III | 3 |
| Triethylene glycol diacetate | 2 |
| Pentaerythritol triacrylate (M.W. 300) | 0.4 |
| 2-ethyl-9,10-anthraquinone | 0.8 |
| Carbon black (particle size 13 millimicrons) | 0.6 |
| Acetone | 33.0 |

The above composition was thoroughly mixed by ball-milling and then coated on the surface of a sheet of polyethylene terephthalate photographic film base 0.004 inch in thickness which was subcoated with a copolymer comprising 90 parts of vinylidene chloride, 10 parts of methyl acrylate, and 2 parts of itaconic acid all by weight as disclosed in Alles et al., U.S. 2,627,088. The photopolymerizable coating was allowed to dry and the final dry coating thickness was 0.0002 inch and the optical density was 2.0. After drying, a sheet of drafting film as described above was laminated, drawing surface in contact with the surface of the coating, at a pressure of 58 lbs./inch$^2$ and a temperature of 94±5° C. The laminated element was exposed through a positive drawing transparency by means of the carbon arc exposure device described in Example II for 3 minutes whereby polymerization took place in the areas which were exposed to the light. After exposure, the exposed element was delaminated by stripping the two support sheets apart at room temperature. The positive image adhered to the drafting film and the negative image adhered to the polyethylene terephthalate photographic film.

*Example IX*

The following photopolymerizable composition was prepared:

| | Grams |
|---|---|
| Polymethyl methacrylate of Example III | 420 |
| Polyethylene glycol (M.W. 300) diacrylate | 347 |
| 2-ethyl-9,10-anthraquinone | 56 |
| Carbon black (particle size 13 millimicrons) | 84 |
| Methyl ethyl ketone | 1370 |

The composition was thoroughly mixed by ball-milling as described in Example III and then coated and laminated as described in Example V. It was exposed for 10 minutes under the conditions described in Example VIII with the result that upon delamination at room temperature, a good quality positive image free of stain and having good resolution was found on the drafting film.

*Example X*

The following photopolymerizable composition was prepared:

| | Grams |
|---|---|
| Polyurethane from piperazine and ethylene-bis-chloroformate made in the manner of Example I of U.S. 2,731,446 | 3 |
| Triacrylate of reaction product of trimethylol propane and ethylene oxide (M.W. 1000) | 4.66 |
| 2-tertiary-butyl-9,10-anthraquinone | 0.4 |
| Carbon black (particle size 13 millimicrons) | 0.6 |
| Methylene chloride | 51.4 |

The composition was thoroughly mixed by ball-milling and then coated on the 0.004 inch photographic film base described in Example VIII to form a hard coating about 0.2 mil thick. A sheet of polyethylene terephthalate film 0.001 inch thick and having a thin anchoring layer of the above polyurethane was laminated to the surface of the photopolymerizable layer in the manner described in Example VIII.

The element was exposed for 16 minutes through the photographic film base side in the device described in Example II and then delaminated at room temperature. Good quality, positive and negative, non-tacky images were found on the 0.001 inch film base and the 0.004 inch film base respectively with no evidence of stain or incomplete image formation.

*Example XI*

The following photopolymerizable composition was prepared:

| | Grams |
|---|---|
| Polyurethane from piperazine and ethylene-bis-chloroformate made in the manner described in Example I of U.S. 2,731,446 | 3 |
| Triacrylate of reaction product of trimethylol propane and ethylene oxide (M.W. 1000) | 3.86 |
| 2-tertiary-butyl-9,10-anthraquinone | 0.2 |
| Carbon black (particle size 13 millimicrons) | 0.6 |
| Methylene chloride | 50.0 |

The composition was thoroughly mixed by ball-milling and then coated on a 0.001 inch thick polyethylene terephthalate film to form a coating when dry of approximately 0.0001 inch in thickness. On the surface of the coating there was laminated a sheet of the polyurethane subbed laminating film of Example X. The laminated element was exposed for 10 minutes as described in Example II. The element was then delaminated at room temperature by stripping apart. Good, clear, sharp images were obtained, the positive being located on the subbed laminating film and the negative on the support on which the composition was coated.

*Example XII*

The following photopolymerizable composition was prepared:

| | Grams |
|---|---|
| Copolymer of methyl methacrylate and methacrylic acid as in Example I | 3.0 |
| Triacrylate monomer of Example X | 6.0 |
| 2-tert-butyl-9,10-anthraquinone | 0.4 |
| Carbon black (particle size 13 millimicrons) | 0.6 |
| Methyl ethyl ketone | 59.0 |

The composition was thoroughly mixed by ball-milling and then coated on the drafting film described in Example I and then laminated to a 0.001 inch polyethylene terephthalate film. The element was exposed for 4 minutes through the 0.001 inch laminated film side and delaminated as described in Example VIII to give good, clear positive and negative images, the positive being on the drafting film.

The above photopolymerizable composition was coated on drafting film and laminated with the 0.001 inch subbed film described in Example X. The coated drafting film was also laminated with the 0.004 inch subbed film of Example I and polypropylene. All elements were exposed through engineering drawings for one to four minutes to the carbon arc exposing device described above through the clear film side of the elements to give the results similar to those described above.

*Example XIII*

A photopolymerizable composition was prepared as follows:

| | Grams |
|---|---|
| Copolymer of methyl methacrylate and methacrylic acid as in Example I | 3.0 |
| Polyurethane of Example X | 1.5 |
| Triacrylate monomer of Example X | 4.0 |
| Carbon black (particle size 13 millimicrons) | 0.6 |
| 2-tert-butyl-9,10-anthraquinone | 0.4 |
| Methylene chloride | 57.0 |

The resulting composition was coated on the drafting film described above and then laminated to 0.001 inch polyethylene terephthalate film. The element was exposed through an engineering drawing for one minute to the carbon arc exposing device described above through the 0.001 inch clear film. Good quality images having good resolution and free of stain were obtained after peeling apart the exposed laminates at room temperature.

Elements made by laminating the polyurethane subbed polyethylene terephthalate film of Example X to the above coated drafting film also gave good results.

*Example XIV*

The following photopolymerizable composition was prepared:

| | Grams |
|---|---|
| Copolymer of Example XII | 13.25 |
| Polyurethane of Example X | 5.62 |
| Triacrylate monomer of Example X | 25.00 |
| 2-tert-butyl-9,10-anthraquinone | 2.50 |
| Carbon black (particle size 13 millimicrons) | 3.75 |
| Methylene chloride | 450.0 |

The resulting composition was thoroughly mixed by ball-milling and coated on 0.001 inch polyethylene terephthalate film to a thickness of 0.0002 inch to produce a layer having an optical density of 0.84. After drying, a sheet of drafting film as described in Example I was laminated to the surface of the photopolymerizable layer. The laminated element was exposed for 30 seconds through an engineering drawing, positive transparency through the 0.001 inch polyethylene terephthalate transparent film by means of the carbon arc exposing device described in Example II. Upon delamination at room temperature a clear, sharp positive film was found on the drafting film having good line continuity and free of background stain.

*Example XV*

A composition was prepared from the following components:

| | Dry wt., grams |
|---|---|
| Polymethyl methacrylate (M.W. 50,000) | 3.0 |
| Carbon black (Example IV) | 0.6 |
| 2-ethyl-9,10-anthraquinone | 0.8 |
| Triethyleneglycol diacetate | 2.0 |
| Pentaerythritol triacrylate (M.W. 298) | 0.4 |
| Acetone to make | 40.0 |

The above composition was thoroughly mixed by ball-milling for 20 hours. The composition was filtered through "Nainsook" and coated on .004 inch film made according to Example IV of Alles U.S. 2,779,684, using a doctor knife having a clearance of 0.006 inch and allowed to air dry overnight. To the coated surface there was laminated the drafting film of Example I by means of rolls at 100° C., at 8 p.s.i. at 2 in./sec. The laminated element exposed through the clear 0.004 inch film for 3 min. on the exposing device described in Example II through a positive image. The exposed element was separated at room temperature to give a good density black positive image on the drafting film.

*Example XVI*

A composition was prepared from the following components:

| | Dry wt., grams |
|---|---|
| Polymethyl methacrylate (Example III) | 3.02 |
| Ethyl violet | 0.01 |
| 2-t-butyl-9,10-anthraquinone | 0.10 |
| Polyethylene glycol (M.W. 600) diacrylate | 2.13 |
| Methylethyl ketone to make | 40 |

The above ingredients were agitated with a magnetic stirrer until dissolved and the weight was readjusted to 40 grams with methyl ethyl ketone. The mixture was coated on 0.001 inch thick polyethylene terephthalate film using a doctor knife having a 0.006 inch clearance and allowed to air dry overnight.

The coating was laminated with the drafting film as described in Example IV. The element was exposed through the clear film support for 1 minute and delaminated at room temperature to give a negative image on the clear film and a positive image of acceptable quality on the drafting film.

*Example XVII*

A composition was prepared from the following components:

| | Dry wt., grams |
|---|---|
| Polymethyl methacrylate of Example III | 420 |
| Carbon black (particle size 13 microns) | 84 |
| 2-ethyl-9,10-anthraquinone | 56 |
| Polyethylene glycol (M.W. 300) diacrylate | 347 |
| Methyl ethyl ketone to make | 4000 |

The above formulation was thoroughly mixed by milling for 71 hours. The composition was coated on 0.001 inch polyethylene terephthalate film using a doctor knife having 0.002 inch clearance. The coating was laminated with the drafting film of Example I by means of hot rolls at 95±5° C. The element was exposed through the clear 0.001 inch film on the exposing device described in Example II for 10 minutes and delaminated at room temperature to give a good, high density black positive on the drafting film.

*Example XVIII*

A composition was prepared from the following components:

| | Dry wt., grams |
|---|---|
| Copolymethyl methacrylate/methacrylic acid of Example I | 3.0 |
| Carbon black (particle size 13 millimicrons) | 0.6 |
| 2-tert-butyl-9,10-anthraquinone | 0.4 |
| Monomer of Example III | 4.0 |
| Methyl ethyl ketone to make | 65 |

The above formulation was thoroughly mixed by milling for 18 hours. After filtration through "Nainsook," the composition was coated on 0.001 inch polyethylene terephthalate film and allowed to air dry overnight. To the surface of the photopolymerizable layer there was laminated the drafting film of Example I. The element was exposed through a printed map for 2 minutes through the polyethylene terephthalate film support by means of the exposing device described in Example II and peeled apart at room temperature to give excellent positive images with no background stain.

*Example XIX*

A composition was prepared from the following components:

| | Dry wt., grams |
|---|---|
| Copolymer of Example I | 2.4 |
| Polyurethane described in Example X | 0.6 |
| Carbon black (particle size 13 millimicrons) | 0.6 |
| Monomer of Example III | 4.0 |
| 2-tert-butyl-9,10-anthraquinone | 0.4 |
| Methylene chloride to make | 65 |

The above formulation was thoroughly mixed by milling for 115 hours and then coated on the drafting film described in Example I and air dried.

The above coating was laminated as described above with (1) the film used for coating in Example III and (2) the subbed film of Example X and the elements were exposed through a positive on the exposing device described in Example II to give excellent positive images on the drafting film on which the photopolymerizable compositions were coated upon delamination at room temperature.

*Example XX*

A photopolymerizable composition similar to that of Example XVIII was made using only 0.1 gram of 2-tert-butyl-9,10-anthraquinone as the photopolymerization initiator. After milling for 95 hours the resulting dispersion was coated on the drafting film described in Example I using a doctor knife having a 0.002 inch clearance. To the surface of the coated layer there was laminated as described in Example III a sheet of 0.001 inch thick, transparent, polyethylene terephthalate film coated with polyurethane as described in Example X. The resulting element was exposed through the subbed film to a line print for 3 minutes by means of the exposing device described in Example II and delaminated at room temperature to give a good, high density positive image on the drafting film.

*Example XXI*

A composition was prepared from the following ingredients:

| | Dry wt., grams |
|---|---|
| Copolymer of Example I | 13.125 |
| Polyurethane described in Example X | 5.625 |
| Carbon black (particle size 13 millimicrons) | 3.750 |
| 2-tert-butyl-9,10-anthraquinone | 2.500 |
| Monomer of Example III | 25.000 |
| Methylene chloride to make | 500 |

The composition was thoroughly mixed in a "Waring" Blendor and filtered through "Nainsook." The dispersion was coated on 0.001 inch polyethylene terephthalate film at a coating speed of 10 ft./min., dried at 54–55° C.; and laminated with the drafting film of Example I at 140±3° C. Upon exposure as described above through a map positive for 1 minute, good clear copy having an optical density of 0.84 was obtained on the drafting film when peeled apart at room temperature.

*Example XXII*

A composition was prepared from the following ingredients:

| | Dry wt., grams |
|---|---|
| Copolymer of Example I | 15 |
| Carbon black (particle size 13 millimicrons) | 3.6 |
| 2-tert-butyl-9,10-anthraquinone | 1 |
| Monomer of Example III | 13.5 |
| Methyl ethyl ketone to make | 325 |

The composition was thoroughly mixed in a "Waring" Blendor and coated on the polyurethane subbed film described in Example X at a coating speed of 15–20 ft./min. and dried at 84° C. to give a dry coating 0.00009 inch thickness. The coated element was laminated with the drafting film of Example I. The resulting element was exposed for 2 minutes through a map image as described above to give a sharp image of excellent quality having a optical density of 0.7 when delaminated at room temperature.

*Example XXIII*

The following composition was prepared:

| | Dry wt., grams |
|---|---|
| Polymethyl methacrylate of Example III | 20.5 |
| Monomer of Example III | 24.0 |
| Carbon black (particle size 13 millimicrons) | 5.04 |
| Phenanthrenequinone | 2 |
| Methyl cellosolve | 100 |
| Trichloroethylene to make | 500 |

The composition was thoroughly mixed in a "Waring" Blendor and coated on a 0.004 inch polyethylene terephthalate film containing 5% by weight of silica and which has been biaxially oriented three times. The coating speed was 10 ft./min. and it was dried at 92.5° C. The coated element was laminated with the polyurethane subbed film of Example X and the element had optical density of 1.26. Upon exposure through a line print image a good copy of high density with no background stain was obtained after being delaminated at room temperature.

*Example XXIV*

A composition was prepared from the following components:

| | Grams |
|---|---|
| Polymethyl methacrylate of Example III | 30 |
| Monomer of Example III | 35 |
| Phenanthrenequinone | 4 |
| Carbon black (particle size 13 millimicrons) | 8 |
| Trichloroethylene to make | 400 |

The mixture was thoroughly mixed by means of a blender type mixer and coated on 0.001 inch thick clear polyethylene terephthalate to give a coating thickness of 0.00015 inch and an optical density of 1.8. Sheets of the resulting coating were laminated as described in Example III with paper (identified as Kromkote marketed by the Champion Paper Corporation), aluminum sheet, steel sheet, copper sheet (Nelco 100 Epoxy Glass Laminate 0.007 inch thick, 1 oz. copper) New England Laminate Corporation, and drafting linen (Oglivie No. 624, Federal Specification CCC–C–00531D).

The elements were exposed through the clear film through a positive image by means of the exposing device described in Example II for the following exposure times:

| | Minutes |
|---|---|
| Paper | 1½ |
| Aluminum | 1½ |
| Steel | 2½ |
| Copper | ¾ |
| Linen | 1½ |

After separation at room temperature of the film base from each element good clear positives of the images were found on the above materials used for laminating.

*Example XXV*

A composition was prepared from the following components:

| | Dry wt., grams |
|---|---|
| Piperazine-2-urethane polymer of Example X | 3.0 |
| Carbon black | 0.6 |
| 2-t-butyl-9,10-anthraquinone | 0.2–0.4 |
| Monomer of Example III | 3.8–4.0 |
| Methylene chloride to make | 60 |

The composition was thoroughly mixed by milling and coated on the drafting film of Example I using a doctor knife having a 0.002 inch clearance and allowed to dry overnight. To the surface of the photopolymerizable layer there was laminated the polyurethane subbed film of Example X. The element was exposed through the subbed film support on the exposing device of Example II through a map positive for 4 minutes to give good positive images on the drafting film upon being peeled apart at room temperature.

*Example XXVI*

The following photopolymerizable composition was prepared:

1870 grams of the triacrylate of the reaction product of trimethylol propane with 20 moles of ethylene oxide (M.W. 1000)
1456 grams of polymethyl methacrylate
390 grams of 9,10-phenanthrenequinone
1518 grams of fast black T.W. powder
264 grams methoxypolyethylene glycol hydrogen succinate in which the polyethylene oxide ether precursor had an average molecular weight of 750
38502 grams trichloroethylene.

The resulting dispersion was coated at 7 feet per minute on a .001 inch thick, polyethylene terephthalate, film support to give a dry thickness of about .00015 inch. The surface of the photopolymerizable layer was laminated, using the triple-nip laminator at 62° C. and 100 p.s.i., to the drawing surface of a drafting film manufactured in the manner of Example I of Van Stappen, U.S. Patent 2,964,423.

A sample of the laminated element was exposed at a setting of 3.0 to a line copy image through the transparent film support by means of a Model 60W, "Revolute Rockette," exposing device manufactured by the Bruning Corporation which uses a mercury vapor lamp (60 watts/in.$^2$) and separated by peeling apart at room temperature. The result was a good positive image on the drawing surface of the drafting film and a negative image on the transparent film support.

*Example XXVII*

A photopolymerizable composition similar to that of Example XXV was coated and laminated using the same supports; however, the coating speed was 9½ feet per minute and the laminating conditions were 77° C. and 135 p.s.i. The sample of the element was exposed and separated at room temperature to give a good line copy image in the same manner as Example XXV.

In addition to the binders mentioned above for the photopolymers, others included:

(A) Copolyesters, e.g., those prepared from the reaction product of a polymethylene glycol of the formula $HO(CH_2)_nOH$, wherein $n$ is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids.

(B) Nylons or polyamides, e.g., N-methoxymethyl polyhexamethylene adipamide;

(C) Vinylidene chloride copolymers, e.g., vinylidene chloride/acrylonitrile; vinylidene chloride/methacrylate and vinylidene chloride/vinylacetate copolymers;

(D) Ethylene/vinyl acetate copolymers;

(E) Cellulosic ethers, e.g., methyl cellulose, ethyl cellulose and benzyl cellulose;

(F) Polyethylene;

(G) Synthetic rubbers, e.g., butadiene/acrylonitrile copolymers, and chloro-2-butadiene-1,3-polymers;

(H) Cellulose esters, e.g., cellulose acetate, cellulose acetate succinate and cellulose acetate butyrate;

(I) Polyvinyl esters, e.g., polyvinyl acetate/acrylate, polyvinyl acetate/methacrylate and polyvinyl acetate;

(J) Polyacrylate and alpha-alkyl polyacrylate esters, e.g., polymethyl methacrylate and polyethyl methacrylate;

(K) High molecular weight polyethylene oxides of polyglycols having average molecular weights from about 4,000 to 1,000,000;

(L) Polyvinyl chloride and copolymers, e.g., polyvinyl chloride/acetate;

(M) Polyvinyl acetal, e.g., polyvinyl butyral, polyvinyl formal;

(N) Polyformaldehydes;

(O) Polyurethanes;

(P) Polycarbonates;

(Q) Polystyrenes.

In addition to the ethylenically unsaturated monomers mentioned above the following free-radical initiated, chain-propagating, addition polymerizable, ethylenically unsaturated compounds having a molecular weight of at least 300 and which can be used with the above-described polymer compounds include preferably an alkylene or a polyalkylene glycol diacrylate prepared from an alkylene glycol of 2 to 15 carbons or a polyalkylene ether glycol of 1 to 10 ether linkages, and those disclosed in Martin and Barney, U.S. Patent 2,927,022, issued Mar. 1, 1960, e.g., those having a plurality of additional polymerizable ethylenic linkages, particularly when present as terminal linkages, and especially those wherein at least one and preferably most of such linkages are conjugated with a doubly bonded carbon, including carbon doubly bonded to carbon and to such hetero-atoms as nitrogen, oxygen and sulfur. Outstanding are such materials wherein the ethylenically unsaturated groups, especially the vinylidene groups, are conjugated with ester or amide structures.

A preferred class of free-radical generating addition polymerization initiators activatable by actinic light and thermally inactive at and below 185° C. includes the substituted or unsubstituted polynuclear quinones which are compounds having two intracyclic carbonyl groups attached to intracyclic carbon atoms in a conjugated carbocyclic ring system. Suitably such initiators include 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10- phenanthrenequinone, 1,2-benzanthraquinone, 2,3 - benzathraquinone, 2 - methyl - 1,4-naphthoquinone, 2,3-dichloronaphthoquinone, 1,4- dimethylanthraquinone, 2,3 - dimethylanthraquinone, 2-phenylanthraquinone, 2,3-diphenylanthraquinone, sodium salt of anthraquinone alphasulfonic acid, 3-chloro-2-methylanthraquinone, retenequinone, 7,8,9,10-tetrahydronaphthacenequinone, and 1,2,3,4-tetrahydrobenz(a)anthracene-7,12-dione. Other photoinitiators which are also useful even though some may be thermally active at temperature as low as 85° C., are described in Plambeck, U.S. Patent 2,760,863 and include vicinal ketaldonyl compounds, such as diacetyl, benzil, etc.; α-ketaldonyl alcohols, such as benzoin, pivaloin, etc., acyloin ethers, e.g., benzoin methyl and ethyl ethers, etc.; α-hydrocarbon substituted aromatic acyloins, including α-allylbenzoin and α-phenylbenzoin.

Suitable thermal polymerization inhibitors that can be used in photopolymerizable compositions include p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl p-cresol, phenothiazine, pyridine, nitrobenzene and dinitrobenzene. Other useful inhibitors include p-toluquinone and chloranil, and thiazine dyes, e.g., Thionine Blue G. (C.I. 52025), Methylene Blue B (C.I. 52015) and toluidine Blue O (C.I. 52040).

In addition to colloidal carbon as a particulate material for incorporation in the photopolymerizable composition, the other suitable pigments include e.g., insoluble salts of dyes and metal complexes of dyes, $TiO_2$, graphite, ceramics, clays, metal powders such as aluminum, copper, magmetic iron and iron oxide, and bronze. Such particles generally range in size from about 5 to 5000 millimicrons.

In addition to the auxiliary plasticizers mentioned in the examples, the following exemplary plasticizers and others known in the art may also be used: triethylene glycol diproprionate; dibenzyl sebecate; diphenyl phosphate and dibutyl phthlate.

The reproduction processes and elements of this invention are useful in many applications. For example, they may be used to make lithographic-offset printing elements because the solid images obtained are substantially resistant to chemical or solvent attack.

The advantages of this invention are many. It is possible to eliminate cumbersome pressure rollers and heating elements from the operation of image reproduction. Vacuum printing frames are also unnecessary. This invention in addition, eliminates the dependency on stick temperatures or tackiness of layers for separation of exposed and unexposed portions of photopolymerizable compositions. It also provides engineering drawings or other reproductions which may be stored in superposed position without the danger of sticking to each other. This invention also provides a means of reproducing images having good dimensional fidelity which is especially important in scaled engineering drawings. It also provides a means of reproducing both negative and positive images of good quality from one simple operation at room temperature.

What is claimed is:

1. A process for image reproduction from a photopolymerizable element having (1) a transparent support, (2) a photopolymerizable layer no greater than 0.0005 inch thick and solid at room temperature, and (3) a second support selected from the group consisting of solid synthetic polymeric sheets, fibrous sheets and metal sheets, said photopolymerizable layer being laminated between said supports, at a temperature of at least 50° C. and adhering more strongly to one support in its exposed state, said process comprises imagewise exposing of said photopolymerizable element to actinic radiation through said transparent support of said element and separating by peeling said supports of the exposed photopolymerizable element apart at room temperature thereby obtaining a positive and negative of said image.

2. A process for image reproduction from a photopolymerizable element having two supports one of which is transparent and laminated between said supports at a temperature of at least 50° C. a photopolymerizable layer of no greater than 0.0005 inch thick and solid at room temperature, said photopolymer adhering more strongly to one of said supports in the unexposed state and to the other support in its exposed state, said process comprises imagewise exposing of said element through said transparent support and separating by peeling said supports apart at room temperature, said exposed photopolymer adhering to the transparent support through which the element was exposed thereby forming a negative on said support.

3. A process as described in claim 1 where said exposed element is separated at 10 to 40° C.

4. A process as described in claim 1 where said photopolymerizable layer comprises a polymeric binder, an ethylenically unsaturated monomer having at least one terminal ethylenic group, a filler selected from the group comprising particulate material and coloring agents and an actinic activatable polymerization initiator, said monomer being present in a ratio of about 10 to 70 parts per 100 parts of binder monomer composition with about 0.2 to 50 parts of filler present based on the total dry weight of said composition and said initiator being present in an amount of about 0.001 to 20 parts by weight of said components.

5. A process as described in claim 4 where said photopolymerizable element has an optical density of greater than 0.80.

6. A process for image reproduction from a photopolymerizable element having (1) a transparent support, (2) a photopolymerizable layer no greater than 0.0005 inch thick and solid at room temperature, and (3) a second support having a matte surface, said photopolymerizable layer being laminated between said supports at a temperature of at least 50° C. said process comprises imagewise exposing of said photopolymerizable element to actinic radiation through said transparent support of said element and separating by peeling said supports of the exposed photopolymerizable element apart at room temperature thereby obtaining a positive and negative of said image.

7. A process as defined in claim 6 where said second support contains a toothing agent of from 0.1 to 10 microns in size.

8. A process as defined in claim 6 where said supports are separated by peeling at a temperature of about 10° to 40° C.

9. A process for image reproduction from a photopolymerizable element having (1) a transparent support, (2) a photopolymerizable layer no greater than 0.0005 inch thick and solid at room temperature, and (3) a second support of a solid synthetic polymeric sheet coated with a polymer of vinyldene chloride, an acrylic ester and itaconic acid, said photopolymerizable layer adhering more strongly to one support in the unexposed state, and to the other support in its exposed state and being laminated at a temperature of at least 50° C. between said supports in contact with the coated surface of said synthetic polymeric sheet, said process comprises imagewise exposing of said photopolymerizable element to actinic radiation through said transparent support of said element and separating by peeling said supports of the exposed element apart at room temperature to give a negative image on said transparent support through which said element was exposed.

10. In a covered photopolymerizable element having (a) a substantially transparent support, (b) a layer of unexposed photopolymerizable composition comprising a polymeric binder, an ethylenically unsaturated monomer with a molecular weight greater than about 295, said monomer being present in a ratio of about 10 to 70 parts per 100 parts of total binder-monomer composition and about 0.001 to 20 parts of an addition polymerization photoinitiator, and (c) an oxygen impermeable cover sheet the improvement which comprises the addition of 0.2 to 50 parts of particulate material or coloring material to said layer (b), said photopolymerizable layer having a dry thickness no greater than 0.0005 inch and an optical density greater than about 0.80 and said cover sheet (c) being a polyester drafting film having a matte surface containing discrete particles with a size from 0.1 to 10 microns, said drafting film surface layer contacting said photopolymerizable layer with the proviso that the adhesion of said unexposed photopolymerizable layer to said drafting film is greater than the adhesion of said unexposed photopolymerizable layer to said transparent support.

11. An element as described in claim 10 where the matte surface of the polyester drafting film contains discrete particles of an inorganic toothing agent or a polyamide particulate material.

References Cited

UNITED STATES PATENTS

| | | | |
|---|---|---|---|
| 2,760,863 | 8/1956 | Plambeck | 95—5.6 |
| 2,791,504 | 5/1957 | Plambeck | 96—84 |
| 3,060,024 | 10/1962 | Burg | 96—28 |
| 3,060,026 | 10/1962 | Heiart | 96—28 |
| 3,219,445 | 11/1965 | Lu Valle | 96—27 |

NORMAN G. TORCHIN, *Primary Examiner.*

R. E. FICHTER, *Assistant Examiner.*